US011667211B2

(12) United States Patent
Sadano et al.

(10) Patent No.: US 11,667,211 B2
(45) Date of Patent: Jun. 6, 2023

(54) CABLE, POWER TRANSFER MANAGING SYSTEM, MANAGING APPARATUS, AND COMPUTER-READABLE STORAGE MEDIUM

(71) Applicant: HONDA MOTOR CO.,LTD., Tokyo (JP)

(72) Inventors: Hakaru Sadano, Saitama (JP); Motoki Hishida, Saitama (JP); Hiroyuki Kanazawa, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 640 days.

(21) Appl. No.: 16/726,952

(22) Filed: Dec. 26, 2019

(65) Prior Publication Data

US 2020/0231063 A1 Jul. 23, 2020

(30) Foreign Application Priority Data

Jan. 17, 2019 (JP) .............................. JP2019-005700

(51) Int. Cl.
*B60L 53/67* (2019.01)
*B60L 53/18* (2019.01)
(Continued)

(52) U.S. Cl.
CPC ............... *B60L 53/67* (2019.02); *B60L 53/18* (2019.02); *B60L 53/65* (2019.02); *B60L 53/665* (2019.02);
(Continued)

(58) Field of Classification Search
CPC .......... B60R 16/033; B60R 16/03; H02J 7/14; H02J 7/35; H02J 7/0049; H02J 2310/46;
(Continued)

(56) References Cited

U.S. PATENT DOCUMENTS

2010/0262566 A1 10/2010 Yamamoto
2011/0001356 A1 1/2011 Pollack
(Continued)

FOREIGN PATENT DOCUMENTS

CN 101896930 A 11/2010
CN 102449572 A 5/2012
(Continued)

OTHER PUBLICATIONS

Office Action issued for counterpart Chinese Application 201911249668.9, issued by the China National Intellectual Property Administration dated Oct. 28, 2022.

*Primary Examiner* — Elim Ortiz

(57) ABSTRACT

A cable that can be used for bidirectional power transmission between a vehicle provided with a driving power source and a power consumer includes: a receiving unit that: communicates with a power-amount acquiring device that is installed at the power consumer, and acquires an amount of power transferred between the power consumer and a power network; and receives identification information of the power consumer; a measuring unit that measures a transmission power amount of power transmitted between the vehicle and the power consumer through the cable; and a transmission information sending unit that sends, to an external managing apparatus that manages an amount of power transmission between the vehicle and the power consumer, the identification information of the power consumer, and information indicating the transmission power amount measured by the measuring unit.

14 Claims, 9 Drawing Sheets

(51) Int. Cl.
| | |
|---|---|
| *B60L 53/65* | (2019.01) |
| *H02J 13/00* | (2006.01) |
| *B60L 53/66* | (2019.01) |
| *B60L 55/00* | (2019.01) |
| *H02J 3/14* | (2006.01) |
| *G01R 22/00* | (2006.01) |
| *G01R 21/00* | (2006.01) |

(52) U.S. Cl.
CPC .............. *B60L 55/00* (2019.02); *H02J 3/144* (2020.01); *H02J 13/00002* (2020.01); *H02J 13/00006* (2020.01); *G01R 21/00* (2013.01); *G01R 22/00* (2013.01); *Y02B 70/3225* (2013.01); *Y02T 90/167* (2013.01)

(58) Field of Classification Search
CPC ...... H02J 2310/40; H02J 7/00; H02J 3/38–50; H02J 2300/22–26; H02J 7/0013; H02J 7/0018; H02J 7/0014; H02J 7/0024; H02J 2207/20; H02J 7/02; H02J 7/007182; H02J 7/0025; H02J 7/0042; H02J 7/1423; H02J 7/345; H02J 9/061; H02J 7/00714; H02J 7/0045; H02J 7/0063; H02J 1/10; H02J 2207/40; H02J 7/00711; H02J 7/007; H02J 7/0036; H02J 1/082; H02J 2300/40; H02J 7/0027; H02J 2207/10; H02J 7/0047; H02J 7/0048; Y02T 10/70; Y02T 10/7072; Y02T 90/12; Y02T 90/14; Y02T 90/16; B60Y 2400/21; H02S 10/40; B62D 33/04–048; B62D 53/125; B60L 58/00; B60L 58/10; B60L 50/00; B60L 53/126; B60L 53/14; B60L 53/18; B60L 53/305; B60L 53/38; B60L 53/63; B60L 53/68; H01M 10/44; G01R 31/371; G01R 22/00; G01R 21/00; Y02E 60/00; Y02E 60/10; Y04S 10/126; G01D 4/00

USPC ........ 280/215, 216, 221, 223, 230; 307/2, 6, 307/8, 9.1, 10.1, 16, 18, 19, 20, 21, 22, 307/25, 26, 29, 37, 38, 43, 45, 54, 48, 57, 307/58, 56, 66, 80; 320/101, 116, 117, 320/118, 119, 120, 121, 122, 124, 125, 320/126, 140, 152, 151, 163, 165, 155, 320/109, 128, 106, 114, 132, 136, 137, 320/139, 150, 160; 323/906; 73/114.59; 363/145; 700/29, 295, 296, 927; 701/99, 701/22; 705/1.1, 412, 7.12, 7.31; 340/870.02, 870.01, 870.026, 870.11, 340/870.03, 870.15, 870.16, 870.39; 702/188, 60, 122, 187, 57, 61

See application file for complete search history.

(56) References Cited

U.S. PATENT DOCUMENTS

| | | | |
|---|---|---|---|
| 2011/0175569 | A1* | 7/2011 | Austin .................. B60L 53/126 320/109 |
| 2012/0143423 | A1 | 6/2012 | Theisen |
| 2014/0249976 | A1 | 9/2014 | Sugimura |
| 2021/0221247 | A1* | 7/2021 | Daniel .................... B60L 53/68 |

FOREIGN PATENT DOCUMENTS

| | | |
|---|---|---|
| CN | 102638084 A | 8/2012 |
| CN | 102803003 A | 11/2012 |
| CN | 103983845 A | 8/2014 |
| JP | 2012194608 A | 10/2012 |
| JP | 2018107984 A | 7/2018 |

* cited by examiner

| CABLE ID | POSITION | POWER CONSUMER ID | PERIOD | TRANSMISSION POWER AMOUNT |
|---|---|---|---|---|
| V100 | POSITION 1 | C001 | 2018-09-30 16:00-16:29 | 0 |
| V100 | POSITION 1 | C001 | 2018-09-30 16:30-16:59 | -0.5 |
| V100 | POSITION 1 | C001 | 2018-09-30 17:00-17:29 | -1 |
| ⋮ | ⋮ | ⋮ | ⋮ | ⋮ |

*FIG. 4*

| POWER CONSUMER ID | PROHIBITION FLAG |
|---|---|
| C002 | TRUE |
| C080 | TRUE |
| ⋮ | ⋮ |

*FIG. 7*

CABLE, POWER TRANSFER MANAGING SYSTEM, MANAGING APPARATUS, AND COMPUTER-READABLE STORAGE MEDIUM

The contents of the following Japanese patent application are incorporated herein by reference: 2019-005700 filed on Jan. 17, 2019.

BACKGROUND

1. Technical Field

The present invention relates to a cable, a power transfer managing system, a managing apparatus, and a computer-readable storage medium.

2. Related Art

There are known technologies for charging secondary cells that accumulate therein power for travelling of electric vehicles, by using an outlet and a power source cable (see Patent Literature 1 explained below, etc., for example).

PRIOR ART LITERATURES

Patent Literatures

Patent Literature 1: Japanese Patent Application Publication No. 2018-107984

SUMMARY

It is assumed that power supply equipment at home, power supply stations, and the like are used as infrastructures for power transfer between vehicles and power networks. However, it is desirable to make it possible to perform power transfer between a vehicle and a power network, for example, through an outlet of another consumer other than the home of a user of the vehicle, and the like in order to increase opportunities for the vehicle to be connected to power networks.

The summary clause does not necessarily describe all necessary features of the embodiments of the present invention. The present invention may also be a sub-combination of the features described above.

BRIEF DESCRIPTION OF THE DRAWINGS

FIG. 4 illustrates, in a table format, one example of information stored in a transmission information storage unit 282.

FIG. 7 illustrates, in a table format, power transfer prohibition information stored in a prohibition information storage unit 284.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention. Note that the identical or similar portions in drawings are given the same reference numbers, and repetitive explanations are omitted in some cases.

Figure 1:
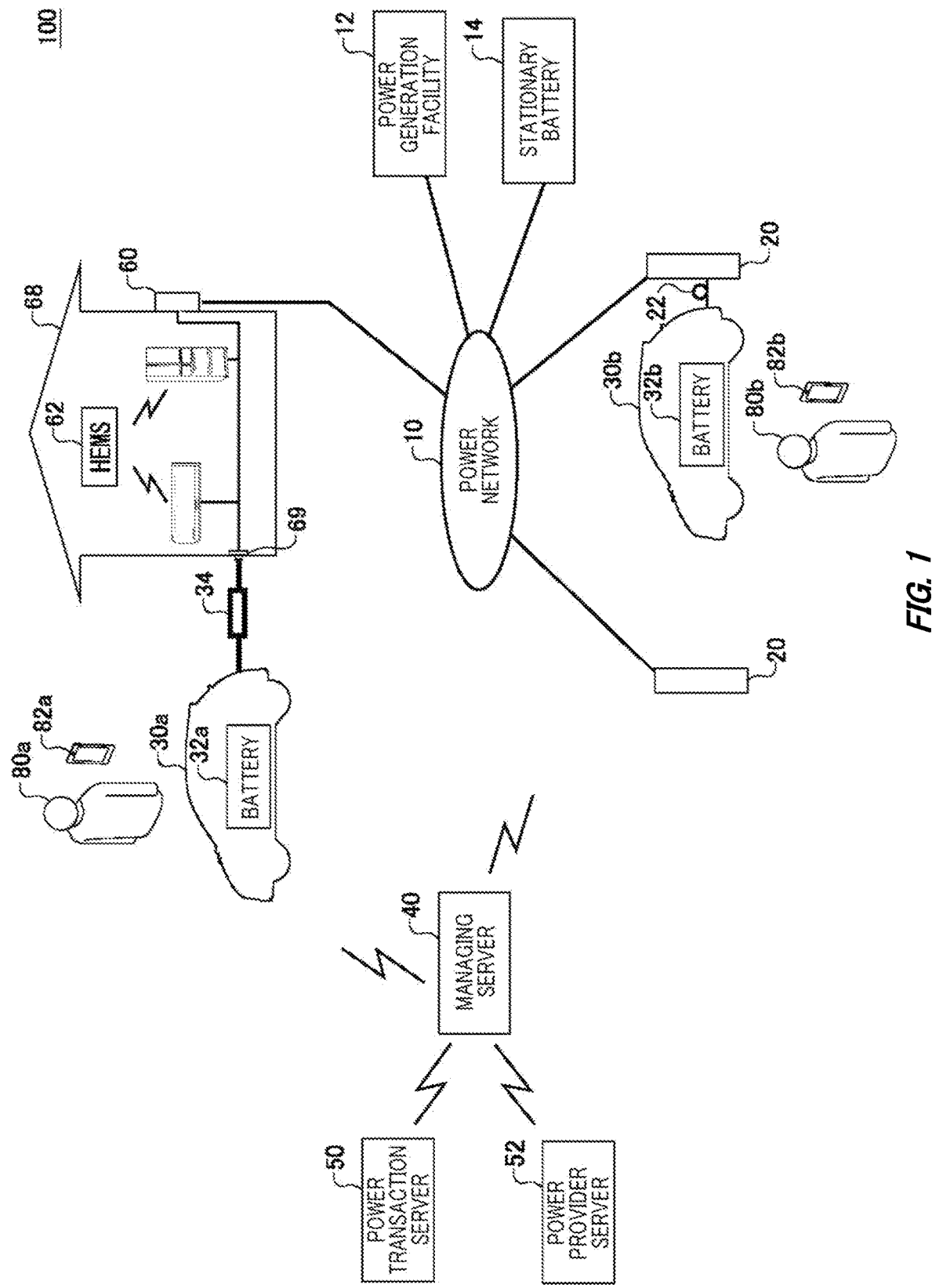
FIG. 1 schematically illustrates the basic configuration of a power transfer managing system 100.

FIG. 1 schematically illustrates the basic configuration of a power transfer managing system 100. The power transfer managing system 100 is a system for a power aggregator, for example, to perform V2G (Vehicle-to-Grid) for exchange of power between vehicles and a power network by using batteries provided to the vehicles. The power transfer managing system 100 has a configuration for connecting a vehicle to a power network through a generally-used power line infrastructure other than a charger/discharger, a charge/discharge station, and the like. Note that, in V2G, at least either release of power by a vehicle to the power network or reception of power by a vehicle from the power network is performed.

The power transfer managing system 100 includes: a plurality of vehicles including a vehicle 30a, and a vehicle 30b; a stationary battery 14; a plurality of charge/discharge facilities 20; a managing server 40; a power generation facility 12; and a plurality of user terminals including a user terminal 82a, and a user terminal 82b.

A user 80a, and a user 80b are users of the power transfer managing system 100. In particular, the user 80a is a user of the vehicle 30a, and the user 80b is a user of the vehicle 30b. Note that a user of a vehicle may be any person who uses the vehicle such as an owner of the vehicle or a family member of the owner. In the present embodiment, the user 80a, and user 80b are generally called a "user 80" in some cases.

The vehicle 30a includes a battery 32a. The vehicle 30b includes a battery 32b. In the present embodiment, the plurality of vehicles including the vehicle 30a, and vehicle 30b are generally called a "vehicle 30" in some cases. In addition, a plurality of batteries including the battery 32a, and battery 32b are generally called a "battery 32" in some cases.

Note that the battery 32 is one example of a driving power source provided to the vehicle 30. The driving power source includes a power source that, like a fuel cell or the like, consumes a fuel to generate electric energy to be provided to a motive power source of the vehicle 30. The fuel may be hydrogen, a hydrocarbon fuel such as gasoline, light oil or natural gas, an alcohol fuel, or the like. The driving power source may be any power source that can generate electric energy to be provided to a motive power source of the vehicle 30.

The vehicle 30 is one example of a transportation device. The vehicle 30 is a vehicle including a motive power source to be driven by electric energy, such as an electric vehicle or a fuel cell vehicle (FCV), for example. Electric vehicles include a battery electric vehicle (BEV), a hybrid vehicle or plug-in hybrid electric vehicle (PHEV) including an internal combustion engine to provide at least part of motive power.

In the present embodiment, the vehicle 30 is an electric vehicle including the battery 32 as a driving power source. In the form employing a battery as a driving power source, battery discharge corresponds to energy release from the driving power source, and battery charge corresponds to energy accumulation in the driving power source. In addition, the battery remaining capacity corresponds to an amount of energy accumulated in the driving power source such as an amount of power or amount of electricity that can be supplied from the driving power source.

The user terminal 82a is a communication terminal used by the user 80a. The user terminal 82b is a communication terminal used by the user 80b. The plurality of user terminals including the user terminal 82a, and user terminal 82b are generally called a "user terminal 82" in some cases.

The user terminal 82 may be a mobile terminal, a personal computer, a vehicle navigation device, or the like, for example. Examples of the mobile terminal include a mobile phone, a smartphone, a PDA, a tablet, a notebook computer, a laptop computer, a wearable computer, and the like.

The managing server 40 is capable of communication with the vehicle 30, stationary battery 14, and user terminal 82 through a communication network. The managing server 40 is also capable of communication with a power transaction server 50, and a power provider server 52 through a communication network. The communication networks may include wired communication or wireless communication transmission paths. The communication networks may include communication networks including the Internet, a P2P network, a dedicated line, a VPN, a power line communication line, a mobile phone line, and the like.

A power network 10 may include a power transmission system or a power distribution system of a power system, or a power distribution network of a power grid. The power network 10 may be provided for each region. The power network 10 may be a micro grid. The power network 10 may be a power distribution network of any scale that connects power devices that consume power, and power sources. For example, the power network 10 may be a power distribution network provided to any of facilities such as commercial facilities. The power network 10 may be provided for each building. The vehicle 30, stationary battery 14, charge/discharge facility 20, and power generation facility 12 are connected to the power network 10. The charge/discharge facility 20, stationary battery 14, and power generation facility 12 are capable of power transfer with the power network 10. Note that the charge/discharge facility 20 is one example of power transfer facilities for the vehicle 30 to perform power transfer with the power network 10. In addition, the charge/discharge facility 20, and stationary battery 14 are each one example of electric facilities for accumulating energy in the driving power source provided to the vehicle 30.

The power generation facility 12 is managed by a power provider such as an electric power company. Charge/discharge facilities 20 include, for example, a charger/discharger installed at a residence, a charge/discharge station installed at a parking lot or public space of a multi-dwelling unit, a building or a commercial facility, and the like.

The vehicle 30 is connected to the charge/discharge facility 20 through a charge/discharge cable 22. That is, the vehicle 30 is connected to the power network 10 through the charge/discharge cable 22, and charge/discharge facility 20. The vehicle 30 performs power transfer between the battery 32 and the power network 10 through the charge/discharge facility 20. For example, the vehicle 30 releases power obtained by discharge of the battery 32 to the power network 10 via the charge/discharge cable 22, and charge/discharge facility 20. In addition, the vehicle 30 charges the battery 32 with power supplied from the power network 10 via the charge/discharge cable 22, and charge/discharge facility 20. In addition, the vehicle 30 is connected to a power distribution line of a residence 68 through a cable 34. That is, the vehicle 30 is connected to the power network 10 through the cable 34 and the power distribution line of the residence 68. The vehicle 30 performs power transfer between the battery 32 and the power network 10 through the cable 34 and the power distribution line of the residence 68. For example, the vehicle 30 releases power obtained by discharge of the battery 32 to the power network 10 via the cable 34 and the power distribution line of the residence 68. In addition, the vehicle 30 charges the battery 32 with power supplied from the power network 10 via the cable 34 and the power distribution line of the residence 68. Note that transfer of power between an entity and a power network 10 is called "power transfer with the power network 10" and the like in some cases.

The stationary battery 14 is managed by the power aggregator. The battery 32 of the vehicle 30 forms a virtual power plant along with the stationary battery 14. The managing server 40 is managed by the power aggregator. The managing server 40 controls power transfer between the battery 32 and the power network 10, and between the stationary battery 14 and the power network 10.

The managing server 40 performs power transaction by bidding in a wholesale power market. The power transaction server 50 is managed by an operator of the wholesale power market. The length of each time segment is defined as 30 minutes, and the managing server 40 places a bid in the power transaction server 50 in every time segment. The managing server 40 causes the battery 32, and stationary battery 14 to discharge power in each time segment based on a contract result to supply the power to the power network 10.

For example, the managing server 40 causes the battery 32, and stationary battery 14 to discharge power according to a contract amount which is a result of bidding in the wholesale power market by the power aggregator to supply the power network 10 with the power released from the battery 32, and stationary battery 14. In addition, the managing server 40 controls charge/discharge of the battery 32, and stationary battery 14 to balance power supply and demand in the power network 10 to an extent of the balancing power agreed in a transaction which is a result of bidding in the supply/demand balancing market by the power aggregator. For example, the managing server 40 controls charge/discharge of the battery 32, and stationary battery 14 according to an increased-demand response (increased-DR), a decreased-demand response (decreased-DR), and a increased/decreased-demand response (increased/decreased-DR) requested by a power transmission/distribution company or a retail electricity supplier.

Specifically, the managing server 40 controls at least one of the vehicle 30 and the charge/discharge facility 20 according to a increased-DR to thereby charge the battery 32 of the vehicle 30 with power received from the power network 10 through the charge/discharge facility 20. In addition, the managing server 40 controls at least one of the vehicle 30 and the charge/discharge facility 20 according to a decreased-DR to thereby cause the battery 32 of the vehicle 30 to discharge power, and cause the power obtained by the discharge of the battery 32 to be released toward the power network 10 through the charge/discharge facility 20.

In the present embodiment, the vehicle 30a is connected to an outlet 69 in the residence 68 through the cable 34 as illustrated in FIG. 1. The residence 68 is one example of power consumers. The residence 68 is a residence of a person other than the user 80a. The cable 34 is a cable that can be used for bidirectional power transmission between the vehicle 30 and the power consumer. In this manner, if the user 80 connects the vehicle 30 to an outlet of the residence 68 of another person, the user 80 does so by using the cable 34. The cable 34 is a carriable cable, and is carried by the vehicle 30.

The cable 34 communicates with the smart meter 60, and HEMS 62 provided in the residence 68 to receive identification information of the smart meter 60, and HEMS 62. The smart meter 60 is managed by a power provider. The smart meter 60 measures 30-minutes values of an amount of power transferred between the power network 10 and the power consumer, and sends the 30-minutes values to the power provider server 52. Note that the HEMS is an abbreviation of Home Energy Management System. The HEMS is one example of an EMS (Energy Management System).

The cable 34 measures a transmission power amount of power transmitted between the vehicle 30 and the outlet 69 through the cable 34. The cable 34 sends, to the managing server 40, the transmission power amount, and the identification information of the smart meter 60, and HEMS 62. The managing server 40 bills the user 80 of the vehicle 30 based on the transmission power amount received from the cable 34. In addition, the managing server 40 sends, to the power provider server 52, the identification information of the smart meter 60, and the transmission power amount that are received from the cable 34. The power provider server 52 bills the power consumer for a power usage fee based on the sum of the power amount measured by the smart meter 60, and the transmission power amount received from the managing server 40. Thereby, it is possible to bill the power consumer correctly while, for example, taking into consideration the transmission power amount of power supplied from the vehicle 30 to the power network 10 through the cable 34, an indoor wire in the residence 68, and the smart meter 60. Thereby, the user 80 can establish a connection to the power network 10 not only through a particular charge/discharge infrastructure such as the charge/discharge facility 20, but also through a generally-used power infrastructure. Because of this, it is possible to increase opportunities for the vehicle 30 to be connected to power networks 10. Accordingly, the power aggregator can more easily keep capacity available for power transfer between the vehicle 30 and power networks 10, and this, in turn, contributes to stabilization of the power network 10.

Note that, in the present embodiment, power transfer means that power exchange from at least one of the vehicle 30 and the power network 10 to the other occurs. For example, power transfer may mean that power release is performed from the vehicle 30 toward the power network 10. In addition, power transfer may mean that power transmission is performed from the power network 10 toward the vehicle 30. Note that if the vehicle 30 releases power through a charger/discharger installed at a power consumer such as a home, net power supply to the power network 10 does not occur at a connection point between the power consumer's side and the power network 10 when the power consumption on the power consumer's side is greater than the power released from the vehicle 30, and the amount of power supply from the connection point to the power consumer simply decreases in some cases. In this case also, it can be considered that power exchange has occurred with the outside of the power network 10 from the perspective of the power network 10. Accordingly, it does not matter in the present embodiment whether or not the power network 10 receives net power from a particular connection point between the power network 10 and the vehicle 30 in power transfer with the power network 10 in which the vehicle 30 releases power.

Figure 2:
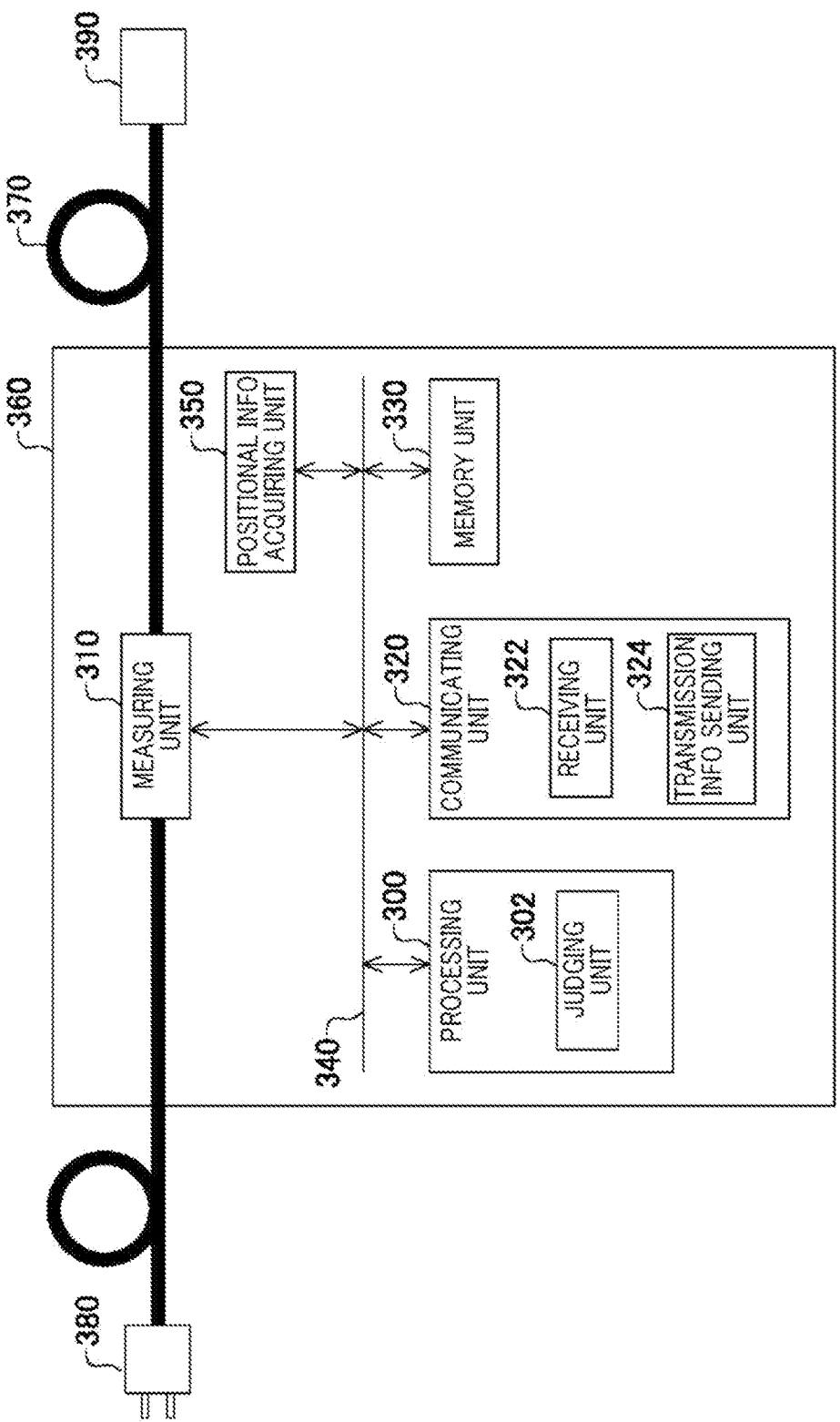
FIG. 2 schematically illustrates the functional configuration of a cable 34.

FIG. 2 schematically illustrates the functional configuration of the cable 34. The cable 34 includes a plug 390, an attachment plug 380, a cable portion 370, and a control apparatus 360. The plug 390 is inserted into a power supply port provided to the vehicle 30. The attachment plug 380 is inserted into the outlet 69.

The control apparatus 360 includes a measuring unit 310, a processing unit 300, a communicating unit 320, a positional information acquiring unit 350, and a memory unit 330. The measuring unit 310, processing unit 300, communicating unit 320, positional information acquiring unit 350, and memory unit 330 are interconnected through a bus 340.

The processing unit 300 is realized by a processing device including a processor. The memory unit 330 is realized by volatile and nonvolatile storage devices. The processing unit 300 performs processes by using information stored in the memory unit 330. The communicating unit 320 is responsible for communication with the smart meter 60, HEMS 62, managing server 40, and user terminal 82. Information that the communicating unit 320 received from the smart meter 60, HEMS 62, and managing server 40 is supplied to the processing unit 300. In addition, information to be sent to the smart meter 60, HEMS 62, and managing server 40 is generated by the processing unit 300, and sent through the communicating unit 320.

The receiving unit 322 communicates with a power-amount acquiring device that is installed at a power consumer, and acquires an amount of power transferred between the power consumer and a power network to receive identification information of the power consumer. Examples of the power-amount acquiring device include the smart meter 60, HEMS 62, and the like. The identification information of the power consumer received by the receiving unit 322 may be identification information of the smart meter 60 or identification information of the HEMS 62.

The measuring unit 310 measures a transmission power amount of power transmitted between the vehicle 30 and the power consumer through the cable 34. The transmission information sending unit 324 sends the identification information of the power consumer, and information indicating the transmission power amount measured by the measuring unit 310 to the external managing server 40 that manages the amount of power transmission between the vehicle 30 and the power consumer. The transmission information sending unit 324 further sends, to the managing server 40, at least one of identification information of the vehicle 30, identification information of the user of the vehicle 30, and identification information of the cable 34. The transmission information sending unit 324 may further send information indicating a period over which power is transmitted between the vehicle 30 and the power consumer.

The positional information acquiring unit 350 acquires positional information indicating the position of the cable 34. For example, the positional information acquiring unit 350 uses a GPS function to acquire information about the latitude and longitude of the position where the cable 34 is at. The transmission information sending unit 324 sends the positional information to the managing server 40.

The receiving unit 322 further receives, from the power-amount acquiring device, at least one of: information indicating an amount of power consumption at the power consumer; information indicating an amount of power that the power consumer received from the power network; and information indicating an amount of power transmitted from the power consumer to the power network. For example, the receiving unit 322 receives, from the smart meter 60, at least one of: information indicating an amount of power that the power consumer received from the power network; and information indicating an amount of power transmitted from the power consumer to the power network. The receiving unit 322 receives, from the HEMS 62, information indicating an amount of power consumption at the power consumer.

The processing unit 300 includes a judging unit 302. The judging unit 302 judges consistency between the information that the receiving unit 322 received from the power-amount acquiring device, and the transmission power amount. For example, if net power is transmitted from the vehicle 30 to the power consumer, the judging unit 302 may judge that the information received from the power-amount acquiring device and the transmission power amount are inconsistent if an amount of power that the power consumer received from the power network 10 has not decreased by a predetermined value or more from the power amount before the power supply from the vehicle 30 to the power consumer.

Note that the receiving unit 322 may receive facility information of the power network 10. The facility information of the power network 10 may be information indicating the capacity or demand rate of various types of facility such as a transformation facility of the power network 10, or the like, for example. The transformation facility of the power network 10 may be a transformer such as a transformer at a substation, a pole transformer between a main line or branch line and a service line, or the like, for example. The judging unit 302 may judge whether or not it is possible to execute power transfer through the cable 34 between the power network 10 and the vehicle 30 based on the facility information received by the receiving unit 322. For example, if the demand rate of the facility is equal to or higher than a predetermined value, the judging unit 302 may judge that power transfer through the cable 34 between the power network 10 and the vehicle 30 is not to be executed. A result of the judgment by the judging unit 302 may be sent to the managing server 40 through the communicating unit 320. The managing server 40 may decide whether to or not to cause power transfer to be executed between the vehicle 30 and the power network 10 based on the result of the judgment by the judging unit 302.

Figure 3:
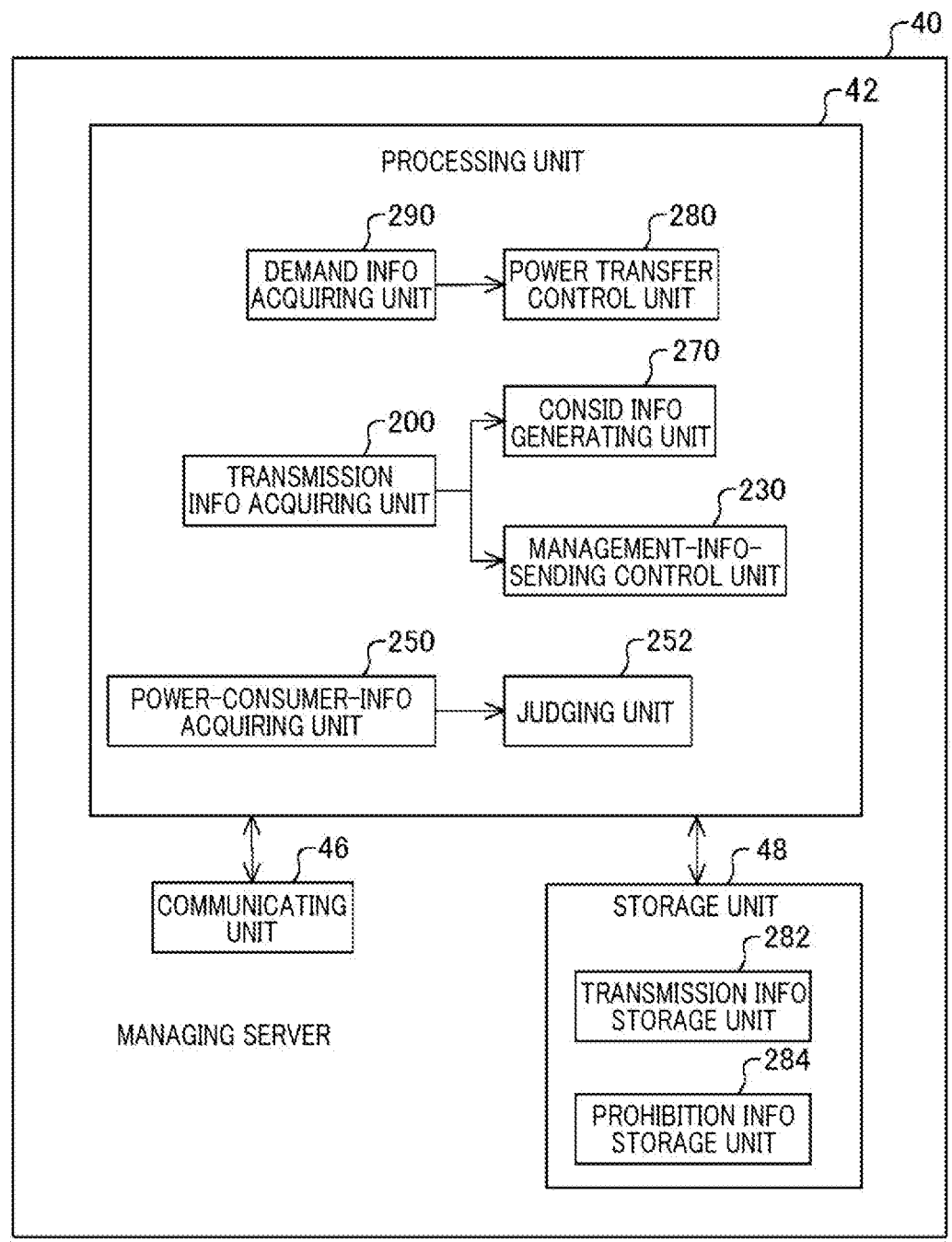
FIG. 3 schematically illustrates the functional configuration of a managing server 40.

FIG. 3 schematically illustrates the functional configuration of the managing server 40. The managing server 40 includes a processing unit 42, a storage unit 48, and a communicating unit 46.

The processing unit 42 is realized by a processing device including a processor. The storage unit 48 is realized by a nonvolatile storage device. The processing unit 42 performs processes by using information stored in the storage unit 48. The communicating unit 46 is responsible for communication with the vehicle 30, stationary battery 14, user terminal 82, power transaction server 50, and power provider server 52. Information received by the communicating unit 46 from the vehicle 30, stationary battery 14, user terminal 82, power transaction server 50, and power provider server 52 is supplied to the processing unit 42. In addition, information to be sent to the vehicle 30, stationary battery 14, user terminal 82, power transaction server 50, and power provider server 52 is generated by the processing unit 42, and sent via the communicating unit 46.

The managing server 40 functions as a managing apparatus. The managing server 40 may be a system realized by one information processing device, or may be a system realized by a plurality of information processing devices.

The processing unit 42 includes a transmission information acquiring unit 200, a management-information-sending control unit 230, a power-consumer information acquiring unit 250, a judging unit 252, a consideration information generating unit 270, a power transfer control unit 280, and a demand information acquiring unit 290. The storage unit 48 includes a transmission information storage unit 282, and a prohibition information storage unit 284.

The demand information acquiring unit 290 acquires information indicating power demand in the power network 10. The power transfer control unit 280 causes the vehicle 30 to perform power transfer with the power network 10 according to the power demand in the power network 10.

The power transfer control unit 280 communicates with the ECU of the vehicle 30 to successively acquire power transferability information indicating whether or not the vehicle 30 is available for power transfer with the power network 10. The ECU of the vehicle 30 determines that the vehicle 30 is available for power transfer with the power network 10 for example if the vehicle 30 is connected to the charge/discharge facility 20 through the charge/discharge cable 22 or if the vehicle 30 is connected to the outlet 69 through the cable 34. If the vehicle 30 is available for power transfer with the power network 10, the power transfer control unit 280 instructs the ECU provided to the vehicle 30 to perform charge/discharge of the battery 32 according to power demand indicated by information acquired by the demand information acquiring unit 290. For example, if power transfer will be performed between the vehicle 30 and the power network 10 through the charge/discharge facility 20, the ECU of the vehicle 30 communicates with the charge/discharge facility 20 according to the instruction of the power transfer control unit 280, and controls a power converter of the vehicle 30 to perform charge of the battery 32 through the charge/discharge facility 20 or release of power obtained through discharge of the battery 32. Note that the power transfer control unit 280 may successively acquire, from the ECU of the vehicle 30, information indicating: an amount of power input from the charge/discharge facility 20 to the power converter at the time of charge of the battery 32; an amount of power output from the power converter to the charge/discharge facility 20 at the time of discharge of the battery 32; and the SOC (State of Charge) of the battery 32. The power transfer control unit 280 may control power transfer between the vehicle 30 and the power network 10 based on the information acquired from the ECU of the vehicle 30.

Note that the contract amount in power transaction mentioned above is one example of the information indicating the power demand. The information indicating the power demand may be a contract price in power transaction or a contract type indicating whether a transaction is a buy contract or a sell contract. In addition, the information indicating the power demand may be information indicating an amount of real-time imbalance between supply and demand in the power network 10 or may be information indicating a predicted value of an amount of future imbalance between supply and demand. The information indicating the power demand may be information indicating a real-time power consumption amount of the power consumer in the power network 10 or a predicted value of the power consumption. Information that can be applied to the information indicating the power demand is not limited to power amounts themselves, but include various types of information that directly or indirectly affects power demand such as temperature information, humidity information, weather information, or event information.

Note that examples of the power transaction market include transaction markets such as a day-ahead market, an intraday market, and a supply/demand balancing power market. Forms that can be applied as the transaction form of power transaction include various transaction forms other than the transaction forms in these power transaction markets.

The transmission information acquiring unit 200 acquires, from the cable 34, identification information of the power consumer, and information indicating the transmission power amount of power transmitted from the vehicle 30 through the cable 34. The consideration information generating unit 270 generates consideration information indicating a consideration for the user of the vehicle 30 based on the transmission power amount. For example, the consideration information may be information indicating a monetary value billed to the user 80 according to a charge amount if net charge is performed in the battery 32 by power transmission performed with the power consumer. The consideration information may be information indicating a monetary value given to the user 80 according to a discharge amount if net discharge is performed in the battery 32 by power transmission performed with the power consumer.

The transmission information storage unit 282 stores the identification information of the power consumer, and the information indicating the transmission power amount in association with each other. Thereby, the managing server 40 can manage through which power consumer power is supplied to the power network 10.

The management-information-sending control unit 230 causes the information received by the transmission information acquiring unit 200 to be sent to the power provider server 52. The management-information-sending control unit 230 causes the information received by the transmission information acquiring unit 200 to be sent to the power provider server 52 through the communicating unit 46. Note that the power provider server 52 is one example of a power amount managing apparatus that manages an amount of power transferred between the power consumer and the power network 10.

Based on the identification information of the power consumer, the power-consumer information acquiring unit 250 acquires at least one of: information indicating an amount of power that the power consumer received from the power network; and information indicating an amount of power transmitted from the power consumer to the power network. For example, the power-consumer information acquiring unit 250 sends the identification information of the power consumer to the power provider server 52, and acquires, from the power provider server 52, at least one of: information indicating an amount of power that the power consumer identified with the identification information received from the power network; and information indicating an amount of power transmitted from the power consumer identified with the identification information to the power network. The judging unit 252 judges consistency between the information acquired by the power-consumer information acquiring unit 250 and the transmission power amount. For example, if net power is transmitted from the vehicle 30 to the power consumer, the judging unit 252 judges that the information acquired by the power-consumer information acquiring unit 250 and the transmission power amount are inconsistent if an amount of power that the power consumer received from the power network 10 has not decreased by a predetermined value or more from the power amount before the power supply from the vehicle 30 to the power consumer.

The transmission information acquiring unit 200 acquires positional information indicating the position of the cable 34 from the cable 34. For example, the transmission information acquiring unit 200 acquires the latitude and longitude information acquired by the positional information acquiring unit 350 of the cable 34. The power-consumer information acquiring unit 250 acquires information indicating the position of the power consumer based on the identification information of the power consumer. For example, the power-consumer information acquiring unit 250 acquires the information indicating the position of the power consumer from a power provider. The information indicating the position of the power consumer may be information indicating a geographic location of the power consumer. The information indicating the position of the power consumer may be information about the address of the power consumer. The information indicating the position of the power consumer may be information indicating a geographic area with a certain breadth. The judging unit 252 judges consistency between information indicating the position of the power consumer acquired by the power-consumer information acquiring unit 250, and the positional information of the cable 34 acquired by the transmission information acquiring unit 200. For example, the judging unit 252 judges that the information indicating the position of the power consumer acquired by the power-consumer information acquiring unit 250, and the positional information of the cable 34 acquired by the transmission information acquiring unit 200 are inconsistent if a distance between the geographic location of the power consumer indicated by the information acquired by the power-consumer information acquiring unit 250, and the geographic location indicated by the positional information is equal to or larger than a predetermined value.

If a result of the judgment by the judging unit 252 indicates inconsistency, the prohibition information storage unit 284 stores prohibition information indicating that the vehicle 30 is not permitted to perform power transfer with the power network 10, and the identification information of the power consumer in association with each other. For example, if the information acquired by the power-consumer information acquiring unit 250, and the transmission power amount are inconsistent, the prohibition information storage unit 284 stores prohibition information indicating that the vehicle 30 is not permitted to perform power transfer with the power network 10, and the identification information of the power consumer in association with each other. In addition, if the information indicating the position of the power consumer acquired by the power-consumer information acquiring unit 250, and the positional information of the cable 34 acquired by the transmission information acquiring unit 200 are inconsistent, the prohibition information storage unit 284 stores prohibition information indicating that the vehicle 30 is not permitted to perform power transfer with the power network 10, and the identification information of the power consumer in association with each other. If identification information of a power consumer newly received from the cable 34, and prohibition information are stored in the prohibition information storage unit 284 in association with each other, the power transfer control unit 280 does not cause the vehicle 30 to perform power transfer through the cable 34 with the power network 10. Thereby, it is possible to inhibit power transfer from being performed with a power consumer for which a power amount has been judged as being inconsistent in the past.

Note that if identification information of a power consumer newly received from the cable 34, and prohibition information are stored in the prohibition information storage unit 284 in association with each other, the power transfer control unit 280 does not permit power supply through the cable 34 from the vehicle 30 to the power network 10, but permits power supply through the cable 34 from the power network 10 to the vehicle 30.

Based on the identification information of the power consumer, the power-consumer information acquiring unit 250 acquires at least one of: information indicating an amount of power that the power consumer received from the power network 10; and information indicating an amount of power transmitted from the power consumer to the power network. The consideration information generating unit 270 further generates consideration information indicating a consideration for the power consumer based on the information acquired by the power-consumer information acquiring unit 250, the identification information of the power consumer, and the transmission power amount. The consideration information may be information indicating a monetary value billed for power that the power consumer received from the power network 10.

With the cable 34, and managing server 40 that are mentioned above, it is possible to establish a connection to the power network 10 not only through a particular charge/discharge infrastructure such as the charge/discharge facility 20, but also through a generally-used power infrastructure. Because of this, it is possible to increase opportunities for the vehicle 30 to be connected to power networks 10. In addition, even if the vehicle 30 is connected to the power network 10 through a power distribution line of the residence 68 which is not the home of the user 80, it is possible to bill the power consumer for the amount of power excluding an amount of power transmitted between the vehicle 30.

Note that functions of the managing apparatus in the present invention may be realized singly by the managing server 40 or may be realized by a combination of the managing server 40 and the ECU of the vehicle 30. For example, at least some of the functions for processes executed by the managing server 40 in the present embodiment may be executed by the ECU of the vehicle 30. For example, at least some of processes executed by the transmission information acquiring unit 200, management-information-sending control unit 230, power-consumer information acquiring unit 250, judging unit 252, consideration information generating unit 270, power transfer control unit 280, demand information acquiring unit 290, transmission information storage unit 282, and prohibition information storage unit 284 may be executed by the ECU of the vehicle 30.

FIG. 4 illustrates, in a table format, one example of information stored in the transmission information storage unit 282. The transmission information storage unit 282 associates a cable ID, a position, a consumer ID, a period, a transmission power amount, and a consideration with each other.

As the cable ID, identification information of the cable 34 is stored. The identification information of the cable 34 is stored in the memory unit 330, and sent to the managing server 40 by the transmission information sending unit 324. Note that, in the present embodiment, the cable 34 is owned by the user 80, and the user 80 can be identified with the cable ID. Because of this, the cable ID can be used as the identification information of the user 80. As the position, positional information acquired by the positional information acquiring unit 350 is stored.

As the consumer ID, identification information that the receiving unit 322 of the cable 34 received from the smart meter 60 is stored. As the consumer ID, identification information that the receiving unit 322 of the cable 34 received from the HEMS 62 may be stored. The consumer ID is one example of identification information of the power consumer.

As the period, a period over which the cable 34 was kept connected to the outlet 69 is stored. For example, the duration of each period stored in the transmission information storage unit 282 may be 30 minutes. The period stored in the transmission information storage unit 282 may be the same as the period during which the smart meter 60 measures a 30-minutes value.

As the transmission power amount, a transmission power amount measured by the measuring unit 310 of the cable 34 is stored. If net power from the outlet 69 to the vehicle 30 is transmitted, the sign of the transmission power amount is the plus sign. If net power from the vehicle 30 to the outlet 69 is transmitted, the sign of the transmission power amount is the minus sign.

As the consideration, information about a consideration for the user 80 is stored. The consideration information is generated by the consideration information generating unit 270. The consideration information generating unit 270 generates the consideration information based on the sum of a basic consideration for the fact that the vehicle 30 is connected to the outlet 69, and a consideration that varies according to the transmission power amount. In the example illustrated in FIG. 4, the basic consideration is ¥1 per 30 minutes. The basic consideration is added even if power transmission is not performed between the vehicle 30 and the outlet 69. The variable consideration is calculated by multiplying the transmission power amount with a predetermined unit price. If net power from the outlet 69 to the vehicle 30 is transmitted, the value of the variable consideration is a negative value. If net power from the vehicle 30 to the outlet 69 is transmitted, the value of the variable consideration is a positive value.

Figure 5:
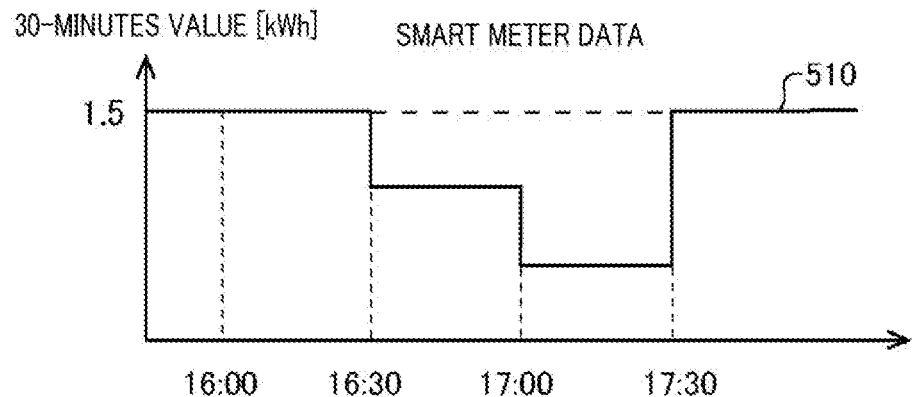
FIG. 5 schematically illustrates one example of 30-minutes values acquired by a smart meter 60, and an HEMS 62.
Figure 5:
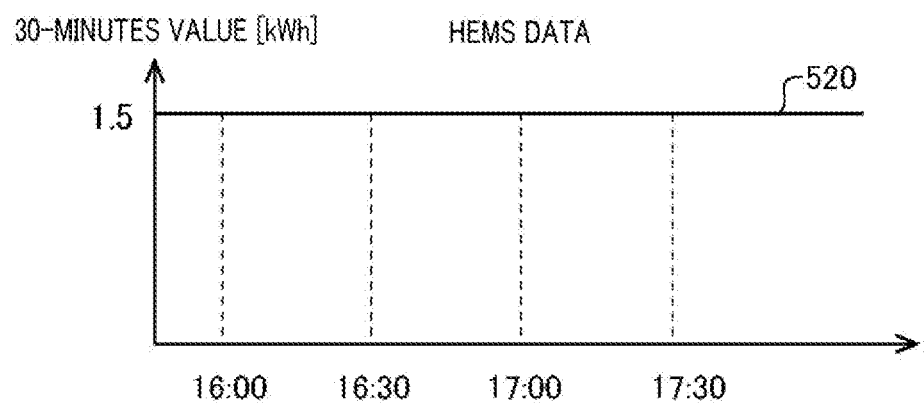

FIG. 5 schematically illustrates one example of 30-minutes values acquired by the smart meter 60, and HEMS 62. The line 510 indicates an amount of average power reception from the power network 10. The average power reception amount is based on 30-minutes values acquired at the smart meter 60. The line 520 indicates an average power consumption amount of a power device managed by the HEMS 62. The average power consumption amount is based on 30-minutes values acquired at the HEMS 62.

As indicated by the line 520, the power consumption amount of the power device in the residence 68 is constant during the period from 16:00 to 17:30. As illustrated in FIG. 4, net power transmission from the vehicle 30 to the outlet 69 occurred during the period from 16:30 to 17:30. Thereby, the amount of power reception at the residence 68 decreased as compared with the period from 16:00 to 16:30. Accordingly, the judging unit 302 of the cable 34 judges that information about a power amount of each period received from the HEMS 62 and a power reception amount of each period received from the smart meter 60 is consistent with a transmission power amount of each period measured by the measuring unit 310.

Note that if the HEMS 62 is acquiring only power consumption of some of power devices in the residence 68, it is not easy to judge consistency perfectly. In addition, if an HEMS 62 is not installed at the residence 68, it is not possible to acquire power consumption information. In such a case, if the difference between a reduction amount of a power reception amount of each period received from the smart meter 60, and a transmission power amount measured at the measuring unit 310 is smaller than a predetermined difference, the judging unit 302 may judge that the power reception amount of each period received from the smart meter 60 is consistent with the transmission power amount of each period measured by the measuring unit 310.

Figure 6:
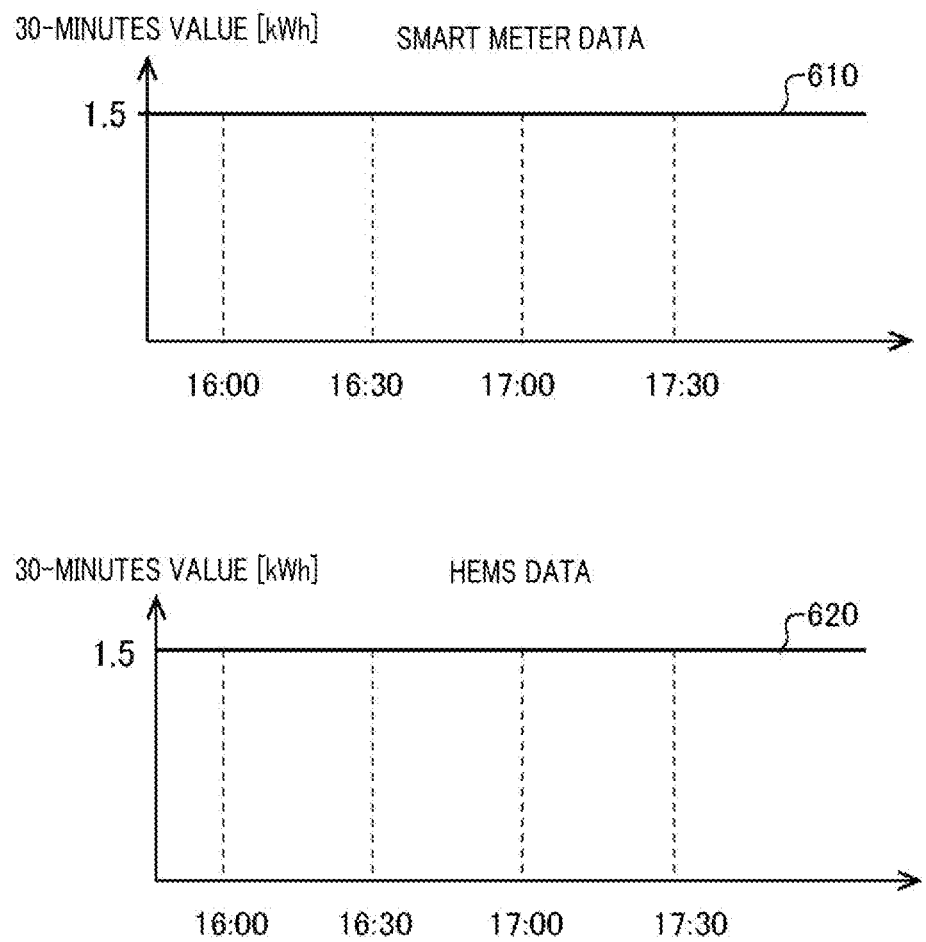
FIG. 6 schematically illustrates a case where a power reception amount of each period received from the smart meter 60, and a transmission power amount of each period measured by a measuring unit 310 are inconsistent.

FIG. 6 schematically illustrates a case where a power reception amount of each period received from the smart meter 60, and a transmission power amount of each period measured by the measuring unit 310 are inconsistent. The line 610 indicates an amount of average power reception from the power network 10, and the line 620 indicates an average power consumption amount of a power device managed by the HEMS 62.

As illustrated in FIG. 6, the amount of power reception from the power network 10 did not decrease during the period from 16:30 to 17:30 despite the fact that net power transmission from the vehicle 30 to the outlet 69 occurred during the period. For example, there is a possibility that power supplied from the vehicle 30 was acquired and consumed by fraud at the residence 68. In such a case, the judging unit 302 judges that a power reception amount of each period received from the smart meter 60, and a transmission power amount of each period measured by a measuring unit 310 are inconsistent. In this case, the transmission information sending unit 324 sends inconsistency information including a consumer ID to the managing server 40. In response to reception of the inconsistency information, the managing server 40 stores power transfer prohibition information in the prohibition information storage unit 284 in association with the consumer ID. The power transfer prohibition information is explained with reference to FIG. 7 and the like.

In the example explained above, net power was transmitted from the vehicle 30 to the outlet 69, and the residence 68 received net power from the power network 10. However, also if net power from the outlet 69 to the vehicle 30 is transmitted, or the residence 68 is transmitting net power to the power network 10, it may be judge whether or not a power transfer amount of each period received from the smart meter 60 is consistent with a transmission power amount of each period measured by the measuring unit 310, based on a transmission power amount measured by the measuring unit 310 or an amount of power transmitted from the residence 68 to the power network 10 that is acquired by the smart meter 60.

FIG. 7 illustrates, in a table format, power transfer prohibition information stored in the prohibition information storage unit 284. The power transfer prohibition information associates a consumer ID, and a prohibition flag with each other. The prohibition flag is one example of prohibition information indicating that the vehicle 30 is not permitted to perform power transfer with the power network 10. If the managing server 40 received a consumer ID from the cable 34, the power transfer control unit 280 does not causes the vehicle 30 to perform power transfer with the power network 10 when TRUE is associated with the consumer ID as a prohibition flag in the prohibition information storage unit 284, even if the vehicle 30 is connected with the power network 10 by the cable 34. In addition, the communicating unit 46 of the managing server 40 sends a power transfer prohibition notification to the cable 34. Thereby, it is possible to inhibit fraud use of power of the vehicle 30.

Note that even if TRUE is associated with the consumer ID as a prohibition flag in the prohibition information storage unit 284, the power transfer control unit 280 may permit only power supply from the power network 10 to the vehicle 30, and the communicating unit 46 may not send a power transfer prohibition notification to the cable 34. Note that if TRUE is associated with the consumer ID as a prohibition flag, the power transfer control unit 280 may not cause the vehicle 30 to perform power transfer with the power network 10 when the remaining capacity of the battery 32 is equal to or larger than a predetermined remaining capacity, and the communicating unit 46 may send a power transfer prohibition notification to the cable 34. Thereby, it becomes possible, through the outlet 69, to keep a minimum charge amount for enabling the vehicle 30 to travel a desired distance, while inhibiting fraud use of power supplied from the vehicle 30.

Figure 8:
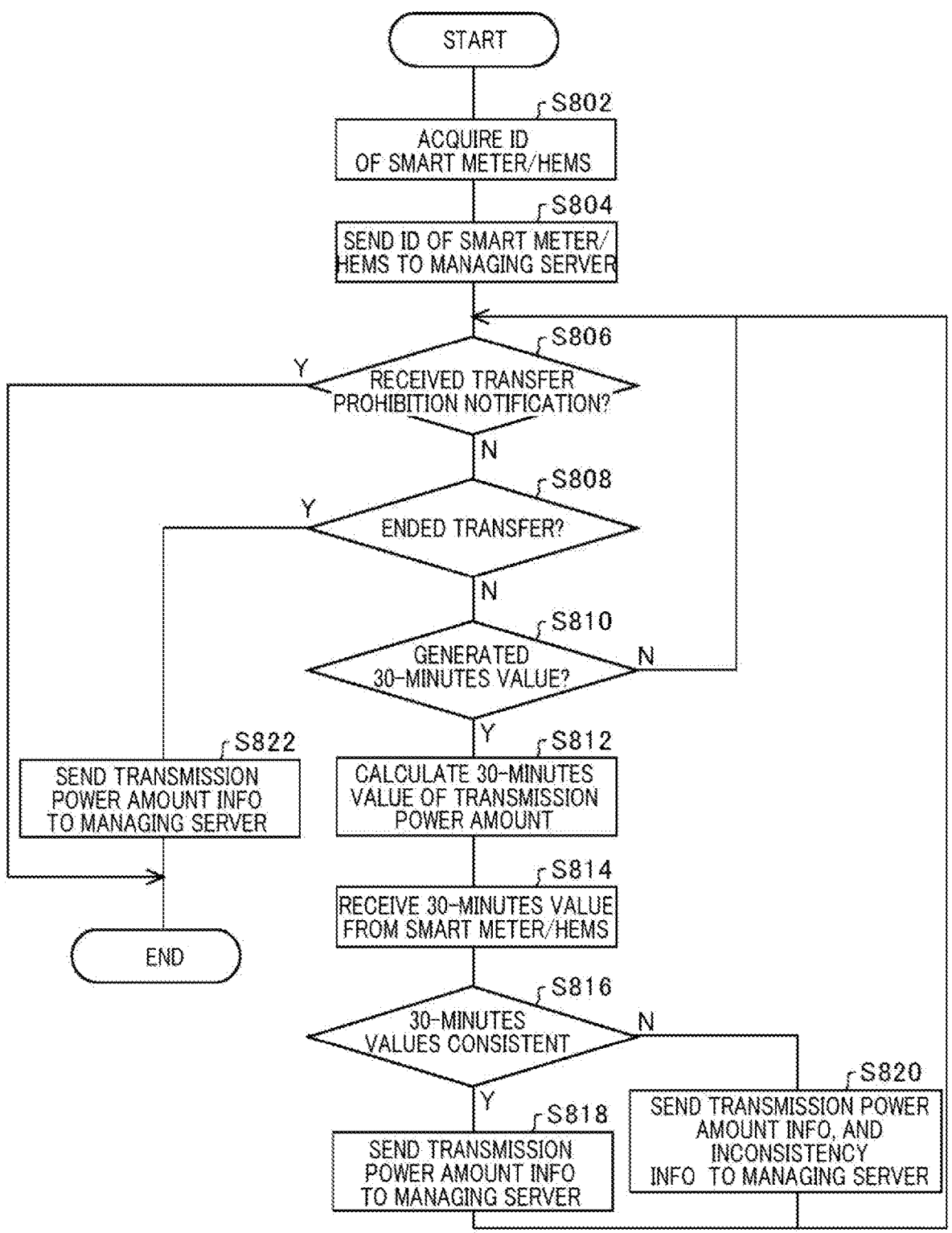
FIG. 8 is a flowchart illustrating processes executed at a cable 34.

FIG. 8 is a flowchart illustrating processes executed at the cable 34. The processes in the flowchart of FIG. 8 are executed mainly at the processing unit 300 of the cable 34. The processes in the flowchart of FIG. 8 are executed for example if the cable 34 is connected to the vehicle 30.

At S802, the receiving unit 322 communicates with the smart meter 60, and HEMS 62 to receive their identification information. The receiving unit 322 may communicate with the smart meter 60, and HEMS 62 through wireless communication or power line communication.

At S804, the transmission information sending unit 324 sends, as a consumer ID to the managing server 40, at least one of: identification information of the smart meter 60; and identification information of the HEMS 62.

At S806, the processing unit 300 determines whether or not a power transfer prohibition notification is received from the managing server 40. If a power transfer prohibition notification is received, the processes in this flowchart are ended. If a power transfer prohibition notification is not received, it is determined at S808 whether or not a power transfer end notification instructing to end power transfer with the power network 10 is received from the managing server 40. If a power transfer end notification is not received from the managing server 40, it is determined at S810 whether or not it is a timing to generate a 30-minutes value of the transmission power amount. If it is not a timing to generate a 30-minutes value of the transmission power amount, the process proceeds to S806. If it is a timing to generate a 30-minutes value of the transmission power amount, at S812, a 30-minutes value of the transmission power amount is calculated based on a history of transmission power measured at the measuring unit 310.

At S814, the receiving unit 322 receives, from the smart meter 60, and HEMS 62, an amount of power transfer between each power consumer and the power network 10, and 30-minutes value of the power consumption amount. At S816, consistency among 30-minutes values of the amount of power transfer between a power consumer and the power network 10, the power consumption amount, and the transmission power amount is judged.

If there is consistency, at S818, the transmission information sending unit 324 sends transmission power amount information to the managing server 40, and the process proceeds to S806. The transmission power amount information includes, for example: 30-minutes values of the amount of power transfer with the power network 10, and the power consumption amount at the power consumer; 30-minutes values of individual transmission power amounts measured at the measuring unit 310; a cable ID, the position of the cable 34; and period information indicating the measurement period of the 30-minutes values. If there is not consistency, at S820, the transmission information sending unit 324 sends, to the managing server 40, the individual 30-minutes values of the amount of power transfer with the power network 10, the power consumption amount, and the transmission power amount, and inconsistency information, and the process proceeds to S806. Note that at S820 the transmission information sending unit 324 may send the inconsistency information also to the user terminal 82, and cause the user terminal 82 to notify the user 80.

If a power transfer end notification is received from the managing server 40 at S808, at S822, an amount of power transmitted since the end time of the previous 30-minutes value measurement period until the current time is calculated as a 30-minutes value based on a history of transmission power measured at the measuring unit 310, information indicating the amount is sent to the managing server 40, and the processes in this flowchart are ended.

Note that if the transmission information sending unit 324 sent inconsistency information to the managing server 40 at S820, the judging unit 252 of the managing server 40 may judge consistency between the transmission power amount of power transmitted through the cable 34, and the power transfer amount acquired at the smart meter 60, based on the information received from the cable 34. In this case, the power-consumer information acquiring unit 250 may acquire, from the power provider server 52: information about an amount of power transfer performed at a power consumer identified with a consumer ID from the cable 34 since a time point which is a predetermined length of time before and until the current time; and past power transfer amount information. The judging unit 252 may judge consistency with a power transfer amount acquired at the smart meter 60, based on the power transfer amount information acquired by the power-consumer information acquiring unit 250. If the judging unit 252 judges that the transmission power amount of power transmitted through the cable 34 is inconsistent with the power transfer amount acquired at the smart meter 60, the power transfer control unit 280 may stop power transfer between the vehicle 30 and the power network 10, the communicating unit 46 may send a power transfer end notification to the cable 34, and the prohibition information storage unit 284 may store a prohibition flag in association with the consumer ID.

Note that even if the judging unit 252 judges that the transmission power amount of power transmitted through the cable 34 is inconsistent with the power transfer amount acquired at the smart meter 60, the power transfer control unit 280 may permit only power supply from the power network 10 to the vehicle 30, and the communicating unit 46 may not send a power transfer end notification to the cable 34.

With the power transfer managing system 100 explained above, it is possible to establish a connection to the power network 10 through an existing power infrastructure such as the outlet 69 of the residence 68 or a power distribution line. Because of this, it is possible to increase opportunities for the vehicle 30 to be connected to power networks 10. In addition, even if the vehicle 30 is connected to the power network 10 through a power distribution line of the residence 68 which is not the home of the user 80, it is possible to appropriately determine an amount to be billed, based on an amount of power supplied to the residence 68. Note that the outlet 69 of the residence 68 and a power distribution line in the present embodiment are examples of power infrastructures. Examples of power infrastructures that can be applied include various infrastructures connected to the power network 10 such as outlets, power distribution lines or power charge stations at buildings other than residences.

Figure 9:
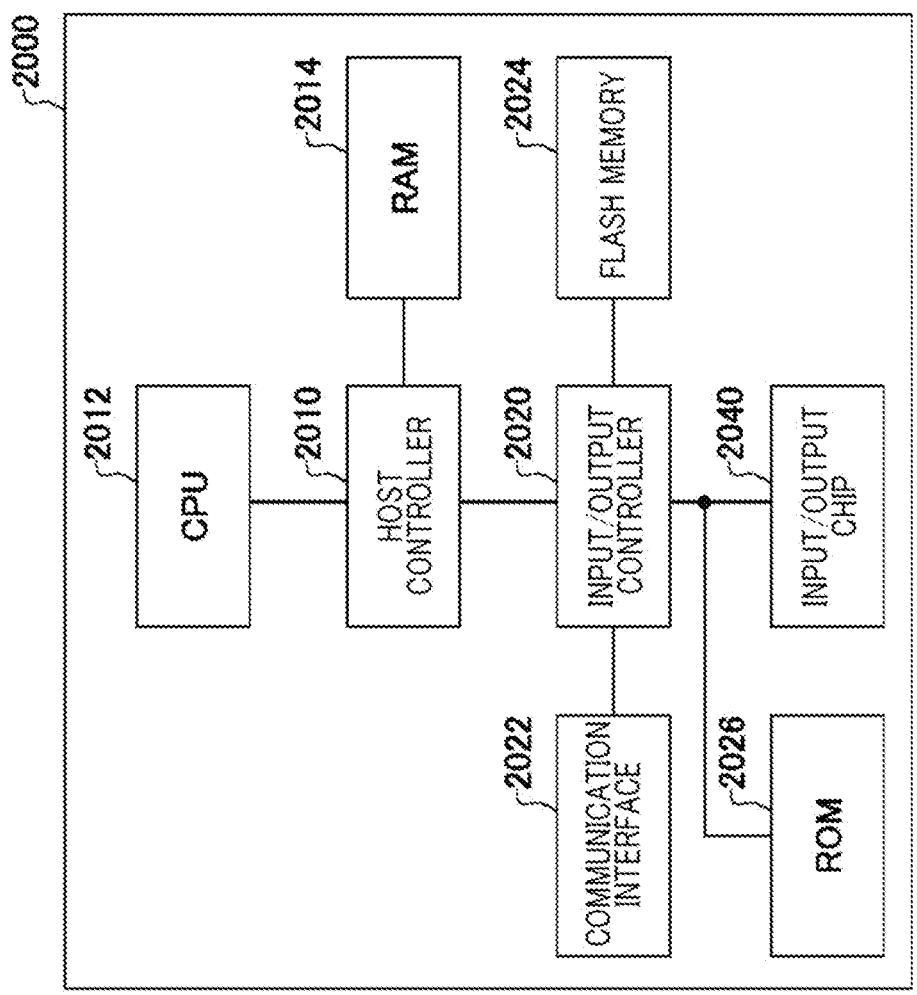
FIG. 9 shows an example of a computer 2000 in which embodiments of the present invention may be wholly or partly embodied.

FIG. 9 shows an example of a computer 2000 in which embodiments of the present invention may be wholly or partly embodied. A program that is installed in the computer 2000 can cause the computer 2000 to function as or perform operations associated with apparatuses such as the managing server 40 or control apparatus 360 of the embodiments or sections thereof, and/or cause the computer 2000 to perform processes of the embodiments of the present invention or steps thereof. Such a program may be executed by the CPU 2012 to cause the computer 2000 to perform certain operations associated with some or all of the blocks of flowcharts and block diagrams described herein.

The computer 2000 according to the present embodiment includes a CPU 2012, and a RAM 2014, which are mutually connected by a host controller 2010. The computer 2000 also includes a ROM 2026, a flash memory 2024, a communication interface 2022, and an input/output chip 2040. The ROM 2026, the flash memory 2024, the communication interface 2022, and the input/output chip 2040 are connected to the host controller 2010 via the input/output controller 2020.

The CPU 2012 operates according to programs stored in the ROM 2026 and the RAM 2014, thereby controlling each unit.

The communication interface 2022 communicates with other electronic devices via a network. The flash memory 2024 stores programs and data used by the CPU 2012 within the computer 2000. The ROM 2026 stores therein a boot program or the like executed by the computer 2000 at the time of activation, and/or a program depending on the hardware of the computer 2000. The input/output chip 2040 may also connect various input/output units such as a keyboard, a mouse and a monitor to the input/output controller 2020 via an input/output port such as a serial port, a parallel port, a keyboard port, a mouse port, a monitor port, a USB port, an HDMI (registered trademark) port and the like.

A program is provided via a computer-readable medium such as a CD-ROM, a DVD-ROM, or a memory card or a network. The RAM 2014, the ROM 2026, or the flash memory 2024 is an example of the computer-readable medium. The program is installed in the flash memory 2024, the RAM 2014, or the ROM 2026, and is executed by the CPU 2012. The information processing described in these programs is read into the computer 2000, resulting in cooperation between a program and the above-mentioned various types of hardware resources. An apparatus or method may be constituted by realizing the operation or processing of information in accordance with the usage of the computer 2000.

For example, when communication is performed between the computer 2000 and an external device, the CPU 2012 may execute a communication program loaded onto the RAM 2014 to instruct communication processing to the communication interface 2022, based on the processing described in the communication program. The communication interface 2022, under control of the CPU 2012, reads transmission data stored on a transmission buffering region provided in a recording medium such as the RAM 2014, the hard disk drive 2024, the DVD-ROM 2001, or the IC card, and transmits the read transmission data to a network or writes reception data received from a network to a reception buffering region or the like provided on the recording medium.

In addition, the CPU 2012 may cause all or a necessary portion of a file or a database to be read into the RAM 2014, the file or the database having been stored in an external recording medium such as the flash memory 2024, and perform various types of processing on the data on the RAM 2014. The CPU 2012 may then write back the processed data to the external recording medium.

Various types of information, such as various types of programs, data, tables, and databases, may be stored in the recording medium to undergo information processing. The CPU 2012 may perform various types of processing on the data read from the RAM 2014, which includes various types of operations, processing of information, condition judging, conditional branch, unconditional branch, search/replace of information, etc., as described throughout this disclosure and designated by an instruction sequence of programs, and writes the result back to the RAM 2014. In addition, the CPU 2012 may search for information in a file, a database, etc., in the recording medium. For example, when a plurality of entries, each having an attribute value of a first attribute associated with an attribute value of a second attribute, are stored in the recording medium, the CPU 2012 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The program or software module explained above may be stored on the computer 2000 or a computer-readable medium located near the computer 2000. A recording medium like a hard disk or a RAM provided in a server system connected to a dedicated communication network or the Internet can be used as such a computer-readable medium. The program stored on the computer-readable medium may be provided to the computer 2000 via a network.

If the computer 2000 is caused to function as the control the control apparatus 360, the programs that are installed on the computer 2000, and make the computer 2000 function as the control apparatus 360 may act on the CPU 2012 or the like to make the computer 2000 function as each unit of the control apparatus 360. Information processing described in these programs are read in by the computer 2000 to thereby make the computer 2000 function as the receiving unit 322, transmission information sending unit 324, and judging unit 302, which are specific means attained by cooperation between software and various types of hardware resources mentioned above. With these specific means, the unique managing server 40 corresponding to a purpose of use of the computer 2000 in the present embodiment can be constructed by realizing operations on or processing of information corresponding to the purpose of use.

If the computer 2000 is caused to function as the managing server 40, the programs that are installed on the computer 2000, and make the computer 2000 function as the managing server 40 may act on the CPU 2012 or the like to make the computer 2000 function as each unit of the managing server 40. Information processing described in these programs are read in by the computer 2000 to thereby make the computer 2000 function as the transmission information acquiring unit 200, management-information-sending control unit 230, power-consumer information acquiring unit 250, judging unit 252, consideration information generating unit 270, power transfer control unit 280, and demand information acquiring unit 290, which are specific means attained by cooperation between software and various types of hardware resources mentioned above. With these specific means, the unique managing server 40 corresponding to a purpose of use of the computer 2000 in the present embodiment can be constructed by realizing operations on or processing of information corresponding to the purpose of use.

Various embodiments of the present invention may be described with reference to block diagrams and the like whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises at least part of an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing device, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. In addition, matters explained about a particular embodiment can be applied to another embodiment as long as such application does not cause technological contradictions. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: power network
12: power generation facility
14: stationary battery
20: charge/discharge facility
22: charge/discharge cable
30: vehicle
32: battery
34: cable
40: managing server
42: processing unit
46: communicating unit
48: storage unit
50: power transaction server
52: power provider server
60: smart meter
62: HEMS
68: residence
69: outlet
80: user
82: user terminal
100: power transfer managing system
200: transmission information acquiring unit
230: management-information-sending control unit
250: power-consumer information acquiring unit
252: judging unit
270: consideration information generating unit
280: power transfer control unit
282: transmission information storage unit
284: prohibition information storage unit
290: demand information acquiring unit
300: processing unit
302: judging unit
310: measuring unit
320: communicating unit
322: receiving unit
324: transmission information sending unit
330: memory unit
340: bus
350: positional information acquiring unit
360: control apparatus
370: cable portion
380: attachment plug
390: plug
510: line
520: line
610: line
620: line
2000: computer
2010: host controller
2012: CPU
2014: RAM
2020: input/output controller
2022: communication interface
2024: flash memory
2026: ROM
2040: input/output chip

What is claimed is:

1. A cable that can be used for bidirectional power transmission between a vehicle provided with a driving power source and a power consumer, the cable comprising:
a control apparatus which comprises:
at least one first processor;
a receiving unit that communicates with a power-amount acquiring device that is installed at the power consumer, and acquires an amount of power transferred between the power consumer and a power network; and receives, from the power-amount acquiring device,
(i) identification information of the power consumer and
(ii) at least one of
(a) information indicating an amount of power consumption at the power consumer,
(b) information indicating an amount of power that the power consumer has received from the power network, and
(c) information indicating an amount of power supplied from the power consumer to the power network;
a measuring unit that measures the transmission power amount of power transmitted between the vehicle and the power consumer through the cable;
a positional information acquiring unit that acquires positional information indicating a position of the cable;
a transmission information sending unit that sends to an external managing apparatus that manages an amount of power transmission between the vehicle and the power consumer, the identification information of the power consumer, and information indicating the transmission power amount measured by the measuring unit; and
a judging unit that judges consistency between the transmission power amount measured by the measuring unit and the information that the receiving unit has received from the power-amount acquiring device, wherein
the transmission information sending unit further sends the positional information acquired by the positional information acquiring unit to the external managing apparatus.

2. The cable according to claim 1, wherein the transmission information sending unit further sends to the external managing apparatus, information indicating a period over which power has been transmitted between the vehicle and the power consumer.

3. The cable according to claim 1, wherein the transmission information sending unit further sends to the external managing apparatus, at least one of: identification information of the vehicle; identification information of a user of the vehicle; and identification information of the cable.

4. The cable according to claim 1, wherein
the power-amount acquiring device is a smart meter, and
the identification information of the power consumer is identification information of the smart meter.

5. The cable according to claim 1, wherein
the power-amount acquiring device is an energy managing system that manages energy used at the power consumer, and the identification information of the power consumer is identification information of a user of the energy managing system.

6. A power transfer managing system comprising:
the cable according to claim 1; and
the external managing apparatus.

7. The power transfer managing system according to claim 6, wherein
the external managing apparatus comprises:
at least one second processor;
at least one storage device;
a transmission information acquiring unit that acquires from the cable, the identification information of the power consumer, and the information indicating the transmission power amount;
a consideration information generating unit that generates consideration information indicating a consideration for a user of the vehicle based on the transmission power amount; and
a transmission information storage unit that stores, in the at least one storage device, the identification information of the power consumer, and the information indicating the transmission power amount in association with each other.

8. The power transfer managing system according to claim 7, wherein the external managing apparatus further comprising a management-information-sending control unit that causes the information acquired by the transmission information acquiring unit to be sent to a different external managing apparatus that manages an amount of power transferred between the power consumer and the power network.

9. The power transfer managing system according to claim 7, wherein
the external managing apparatus further comprising a power-consumer information acquiring unit that acquires at least one of: information indicating an amount of power that the power consumer has received from the power network; and information indicating an amount of power transmitted from the power consumer to the power network, based on the identification information of the power consumer, and
the consideration information generating unit further generates consideration information indicating a consideration for the power consumer based on the information acquired by the power-consumer information acquiring unit, the identification information of the power consumer, and the transmission power amount.

10. The power transfer managing system according to claim 7, wherein
the transmission information acquiring unit of the external managing apparatus further acquires from the cable, the positional information indicating the position of the cable, and
the external managing apparatus further comprising:
a power-consumer information acquiring unit that acquires information indicating a position of the power consumer based on the identification information of the power consumer; and
a judging unit that judges consistency between the information acquired by the power-consumer information acquiring unit, and the positional information.

11. The power transfer managing system according to claim 6, wherein
the external managing apparatus further comprising:
a power-consumer information acquiring unit that acquires at least one of: information indicating an amount of power that the power consumer has received from the power network; and information indicating an amount of power transmitted from the power consumer to the power network, based on the identification information of the power consumer; and
a judging unit that judges consistency between the information acquired by the power-consumer information acquiring unit, and the transmission power amount.

12. The power transfer managing system according to claim 10, wherein
the external managing apparatus further comprising:
a power transfer control unit that causes the vehicle to perform power transfer with the power network according to power demand of the power network; and
a prohibition information storage unit that stores, in the at least one storage device, when a result of the judgement by the judging unit indicates inconsistency, prohibition information indicating that the vehicle is not permitted to perform power transfer with the power network, and the identification information of the power consumer in association with each other, and
when identification information of a power consumer newly received from the cable, and the prohibition information are stored in the prohibition information storage unit in association with each other, the power transfer control unit does not perform power transfer between the vehicle and the power network through the cable.

13. The power transfer managing system according to claim 10, wherein
the external managing apparatus further comprising:
a power transfer control unit that causes the vehicle to perform power transfer with the power network according to power demand of the power network; and
a prohibition information storage unit that stores, in the at least one storage device, when a result of the judgement by the judging unit indicates inconsistency, prohibition information indicating that the vehicle is not permitted to perform power transfer with the power network, and the identification information of the power consumer in association with each other, and
when identification information of a power consumer newly received from the cable, and the prohibition information are stored in the prohibition information storage unit in association with each other, the power transfer control unit does not permit power transmission from the vehicle to the power network through the cable, and permits power transmission from the power network to the vehicle through the cable.

14. An
external managing apparatus coupled to a cable comprising:
at least one processor;
at least one storage device;
a transmission information acquiring unit that acquires from the cable, identification information of a power consumer, and information indicating a transmission power amount of power transmitted between a vehicle provided with a driving power source and the power consumer through the cable, the cable being a cable that can be used for bidirectional power transmission between the vehicle and the power consumer, the cable comprising:
- a receiving unit that communicates with a power-amount acquiring device that is installed at the power consumer, and acquires an amount of power transferred between the power consumer and a power network; and receives, from the power-amount acquiring device,
  - (i) the identification information of the power consumer and
  - (ii) at least one of
    - (a) information indicating an amount of power consumption at the power consumer,
    - (b) information indicating an amount of power that the power consumer has received from the power network, and
    - (c) information indicating an amount of power supplied from the power consumer to the power network;
- a measuring unit that measures the transmission power amount;
- a positional information acquiring unit that acquires positional information indicating a position of the cable;
- a transmission information sending unit that sends to the external managing apparatus that manages the amount of power transmission between the vehicle and the power consumer, the identification information of the power consumer, and information indicating the transmission power amount measured by the measuring unit;
- the transmission information sending unit further sending the positional information acquired by the positional information acquiring unit to the external managing apparatus;
- a judging unit that determines consistency between a measured transmission power amount and the information received from the power-amount acquiring device,
- a consideration information generating unit that generates consideration information indicating a consideration for a user of the vehicle based on the transmission power amount; and
- a storage device that stores the identification information of the power consumer, and the information indicating the transmission power amount in association with each other.

* * * * *